US012683121B2

(12) United States Patent
Dash

(10) Patent No.: US 12,683,121 B2
(45) Date of Patent: Jul. 14, 2026

(54) PULSED VOLTAGE PLASMA PROCESSING APPARATUS AND METHOD

(71) Applicant: Applied Materials, Inc., Santa Clara, CA (US)

(72) Inventor: Shreeram Jyoti Dash, San Jose, CA (US)

(73) Assignee: Applied Materials, Inc., Santa Clara, CA (US)

( * ) Notice: Subject to any disclaimer, the term of this patent is extended or adjusted under 35 U.S.C. 154(b) by 649 days.

(21) Appl. No.: 17/976,578

(22) Filed: Oct. 28, 2022

(65) Prior Publication Data

US 2024/0145215 A1 May 2, 2024

(51) Int. Cl.
*H01J 37/32* (2006.01)

(52) U.S. Cl.
CPC .. *H01J 37/32146* (2013.01); *H01J 37/32091* (2013.01); *H01J 37/321* (2013.01); *H01J 37/32128* (2013.01); *H01J 2237/3341* (2013.01)

(58) Field of Classification Search
None
See application file for complete search history.

(56) References Cited

U.S. PATENT DOCUMENTS 5,983,828 A * 11/1999 Savas ..................... H01J 37/321
216/68
11,462,388 B2 10/2022 Dorf et al.
11,462,389 B2 10/2022 Dorf et al.
(Continued)

FOREIGN PATENT DOCUMENTS

JP 2020004710 A 1/2020
KR 1020200100642 A 8/2020
TW 202029842 A 8/2020

OTHER PUBLICATIONS

International Search Report/ Written Opinion issued to patent application to PCT/US2023/010073 on Jul. 24, 2023.
(Continued)

*Primary Examiner* — Binh X Tran
(74) *Attorney, Agent, or Firm* — Patterson + Sheridan, LLP

(57) ABSTRACT

Embodiments provided herein generally include apparatus, plasma processing systems and methods for generation of a waveform for plasma processing of a substrate in a processing chamber that configured to adjust the timing and characteristics of the asymmetric voltage waveforms that are each provided to one or more electrodes or coils in a plasma processing chamber in an effort to improve the control of various characteristics of the generated plasma and control an ion energy distribution (IED) for the plasma generated ions that interact with a surface of a substrate during plasma processing. The methods and apparatus disclosed herein are configured to control and sustain a plasma formed in a processing region of the plasma processing chamber without the need for the delivery of a radio frequency (RF) waveform during processing. The ability to synchronize and control waveform characteristics, such as frequency, slope of the portions of the voltage waveform, waveform shape and applied voltage on-time during a pulse period, of the voltage pulses provided in each of the pulsed voltage waveforms applied to different electrodes and/or coils allows for an improved control of the generated plasma.

19 Claims, 10 Drawing Sheets

(56)        References Cited

U.S. PATENT DOCUMENTS

| 2006/0019039 A1* | 1/2006 | Hanawa ................ C23C 16/045 |
| | | 427/523 |
| 2012/0048831 A1* | 3/2012 | Rueger ............ H01L 21/67069 |
| | | 156/345.43 |
| 2019/0035606 A1* | 1/2019 | Yoo ................... H01J 37/32146 |
| 2020/0135527 A1 | 4/2020 | Sung et al. |
| 2021/0134562 A1 | 5/2021 | Fairbairn et al. |
| 2021/0343506 A1 | 11/2021 | Xie et al. |
| 2022/0037119 A1* | 2/2022 | Dorf ................ H01J 37/32146 |
| 2022/0037121 A1 | 2/2022 | Dorf et al. |
| 2023/0030927 A1 | 2/2023 | Dorf et al. |

OTHER PUBLICATIONS

Office Action from Taiwanese Patent Application No. 112100813 dated Nov. 12, 2025.
Office Action from South Korean Patent Application No. 10-2025-7017127 dated Feb. 2, 2026.

\* cited by examiner

PULSED VOLTAGE PLASMA PROCESSING APPARATUS AND METHOD

BACKGROUND

Field

Embodiments of the present disclosure generally relate to a system used in semiconductor device manufacturing. More specifically, embodiments of the present disclosure relate to a plasma processing system used to process a substrate.

Description of the Related Art

Reliably producing high aspect ratio features is one of the key technology challenges for the next generation of semiconductor devices. One method of forming high aspect ratio features uses a plasma-assisted etching process to bombard a material formed on a surface of a substrate through openings formed in a patterned mask layer formed on the substrate surface.

With technology nodes advancing towards 2 nm, the fabrication of smaller features with larger aspect ratios requires atomic precision for plasma processing. For etching processes where the plasma ions play a major role, ion energy control is always challenging the development of reliable and repeatable device formation processes in the semiconductor equipment industry. In a typical plasma-assisted etching process, the substrate is positioned on an electrostatic chuck (ESC) disposed in a processing chamber, a plasma is formed over the substrate by use of a radio frequency (RF) source that is coupled to an electrode disposed on or within the plasma processing chamber, and ions are accelerated from the plasma towards the substrate across a plasma sheath. Additionally, RF substrate biasing methods, which require the use of a separate RF biasing source in addition to the RF source that is used to initiate and maintain the plasma in the processing chamber, have been unable to desirably control the plasma sheath properties to achieve desirable plasma processing results that will allow the formation of these smaller device feature sizes. The traditional RF source and RF biasing methods utilize sinusoidal RF waveforms to excite the plasma and form the plasma sheath. It has been found that the use of RF waveforms that require the use of an RF match to adjust the RF power source's output to match the load impedance can lead to limitations in the ability of the RF system to create desirable pulsed waveform shapes due to limitations in the speed that the RF match circuitry within the RF system can react to the changing impedance of the plasma load due to the fluctuations created by the delivery of the pulsed waveform shapes. Thus, conventional methods of utilizing RF waveforms has been challenging, and often leads to inconsistent process results and/or damage to the supporting electrical and hardware components.

Accordingly, there is a need in the art for pulsed voltage source and biasing methods that are able to enable the completion of a desirable plasma-assisted process on a substrate.

SUMMARY

Embodiments provided herein generally include apparatus, plasma processing systems and methods for generation of a waveform for plasma processing of a substrate in a processing chamber.

Embodiments of the disclosure include a plasma processing system, comprising a plurality of pulsed voltage waveform generators; a plurality of electrodes or coils that are each positioned and configured to alter a characteristic of a plasma formed in a processing volume of a plasma processing chamber of the plasma processing system when an asymmetric voltage waveform is provided to the electrode or coil from a pulsed voltage waveform generator of the plurality of pulsed voltage waveform generators, wherein each electrode or coil is coupled to a different pulsed voltage waveform generator of the plurality of pulsed voltage waveform generators; and a system controller that is configured synchronize a delivery of the asymmetric voltage waveforms to each of the electrodes or coils from their pulsed voltage waveform generator. The plurality of electrodes or coils may also include a first coil that is coupled to a first pulsed voltage waveform generator of the plurality of pulsed voltage waveform generators, and the first pulsed voltage waveform generator is configured to deliver an asymmetric voltage waveform that comprises a plurality of stages that vary between a first voltage level and second voltage level.

Embodiments of the disclosure may further include a plasma processing system, comprising: a plurality of pulsed voltage waveform generators; a plurality of electrodes or coils that are each positioned and configured to alter a characteristic of a plasma formed in a processing volume of a plasma processing chamber of the plasma processing system when an asymmetric voltage waveform is provided to the electrode or coil from a pulsed voltage waveform generator of the plurality of pulsed voltage waveform generators, wherein each electrode or coil is coupled to a different pulsed voltage waveform generator of the plurality of pulsed voltage waveform generators; and a system controller that is configured synchronize a delivery of the asymmetric voltage waveforms to each of the electrodes or coils from their pulsed voltage waveform generator. In some embodiments, a sinusoidal waveform, such as an RF waveform, is not present within the processing volume during the delivery of the first asymmetric voltage waveform and the delivering the second asymmetric voltage waveform. In some embodiments, during substantially all of a plasma process performed on a substrate the plasma is not sustained in the processing volume by use of a sinusoidal waveform. In some embodiments, during the process of delivering the first asymmetric voltage waveform and delivering the second asymmetric voltage waveform they are the only source of electrical energy used to sustain the plasma.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope and may admit to other equally effective embodiments.

Figure 1:
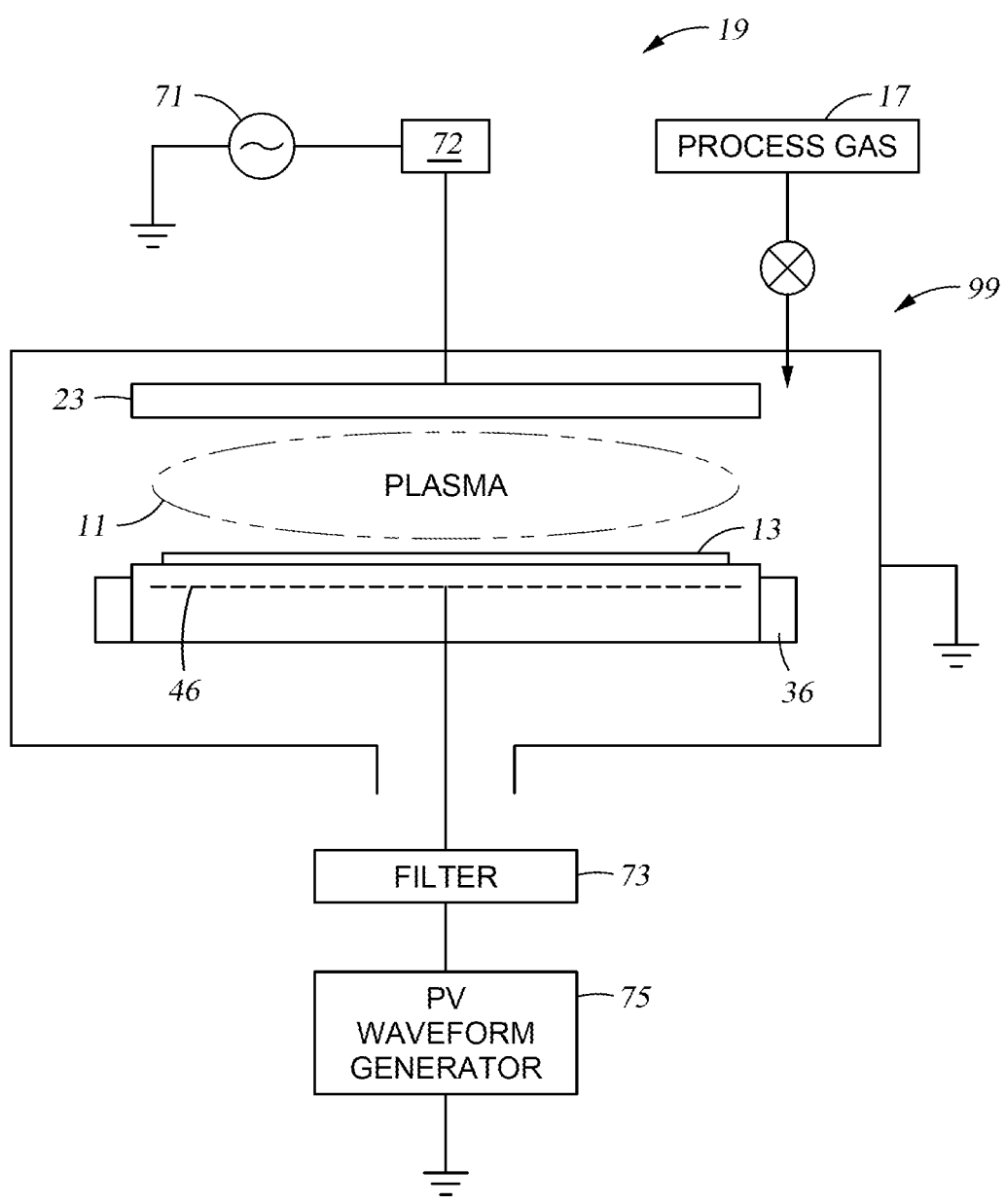
FIG. 1 is a schematic view of a conventional plasma processing system.

To facilitate understanding, identical reference numerals have been used, where possible, to designate identical elements that are common to the figures. It is contemplated that elements and features of one implementation may be beneficially incorporated in other implementations without further recitation.

DETAILED DESCRIPTION

Embodiments of the present disclosure are generally directed to plasma processing methods and apparatus that are configured to deliver a plurality of asymmetric pulsed voltage waveforms to a plurality of electrodes within a plasma processing chamber to control and sustain a plasma formed in a processing region of the plasma processing chamber. The plasma processing methods and apparatus described herein are configured to improve the control of various characteristics of the generated plasma and control an ion energy distribution (IED) of the plasma generated ions that interact with a surface of a substrate during plasma processing. Some embodiments of the present disclosure are configured control and sustain a plasma formed in a processing region of the plasma processing chamber without the need for the delivery of a radio frequency (RF) waveform during processing. The ability to synchronize and control waveform characteristics, such as frequency, waveform shape and applied voltage on-time during a pulse period, of the voltage pulses provided in each of the pulsed voltage waveforms applied to different electrodes and/or coils allows for an improved control of the generated plasma. The embodiments disclosed herein will also provide a reduction in system complexity and cost since the need for RF delivery and RF matching components and their often complex RF tuning algorithms are not required to perform a plasma process in the plasma processing chamber. As a result, greater precision for plasma processing can be achieved, which is described herein in more detail.

FIG. 1 is a schematic view of a conventional plasma processing system 19 that is adapted to process a substrate 13 disposed on a substrate support 36 by generating a plasma 11 within the processing region 29 of the plasma processing chamber 99. The plasma processing system 19 is configured to form a capacitively coupled plasma (CCP), where the processing chamber 99 includes an upper electrode 23 disposed in the processing region 29 so that it is facing a lower electrode 46 that is also disposed in the processing region 29. The CCP plasma processing system, includes a radio frequency (RF) source 71 is electrically coupled to the upper electrode 23 through an RF match 72, and delivers a tuned RF signal that is configured to ignite and maintain a plasma 11 formed in the processing region 29. Typically, the lower electrode 46 is coupled to ground or to a second RF power source, but in some configurations, as shown in FIG. 1, the lower electrode is coupled to pulsed voltage (PV) waveform generator 75 through an RF filter 73. However, in conventional plasma processing configurations, such as shown in FIG. 1A, in which PV waveforms and RF signals are simultaneously being provided to one or more electrodes to form the plasma 11, the impedance of a complex load created by the plasma 11 will fluctuate at least in part due to a varying RF power level and/or varying voltage applied in each of the voltage pulses provided in the PV waveform provided from the PV waveform generator 75. Which, as discussed above, leads to the inefficient delivery of the RF power to the complex load due to the inability of the RF match components to rapidly adjust their match point to compensate for the varying impedance of the complex load. Also, RF plasma containing processes that require the use of a RF match are unable to rapidly adjust for changing RF power levels delivered during processing due to inability of the RF components to adjust and tune their match point and thus are limited in their ability to control various plasma characteristics that require control or variation on a less than 10 microsecond (μs) scale. Conventional RF plasma processes are unable perform at fast RF pulsing speeds due to limitations in impedance matching/frequency tuning convergence times (e.g., ~25-100 us), hence plasma process results are not very repeatable.

Plasma Processing System Examples

Figure 2A:
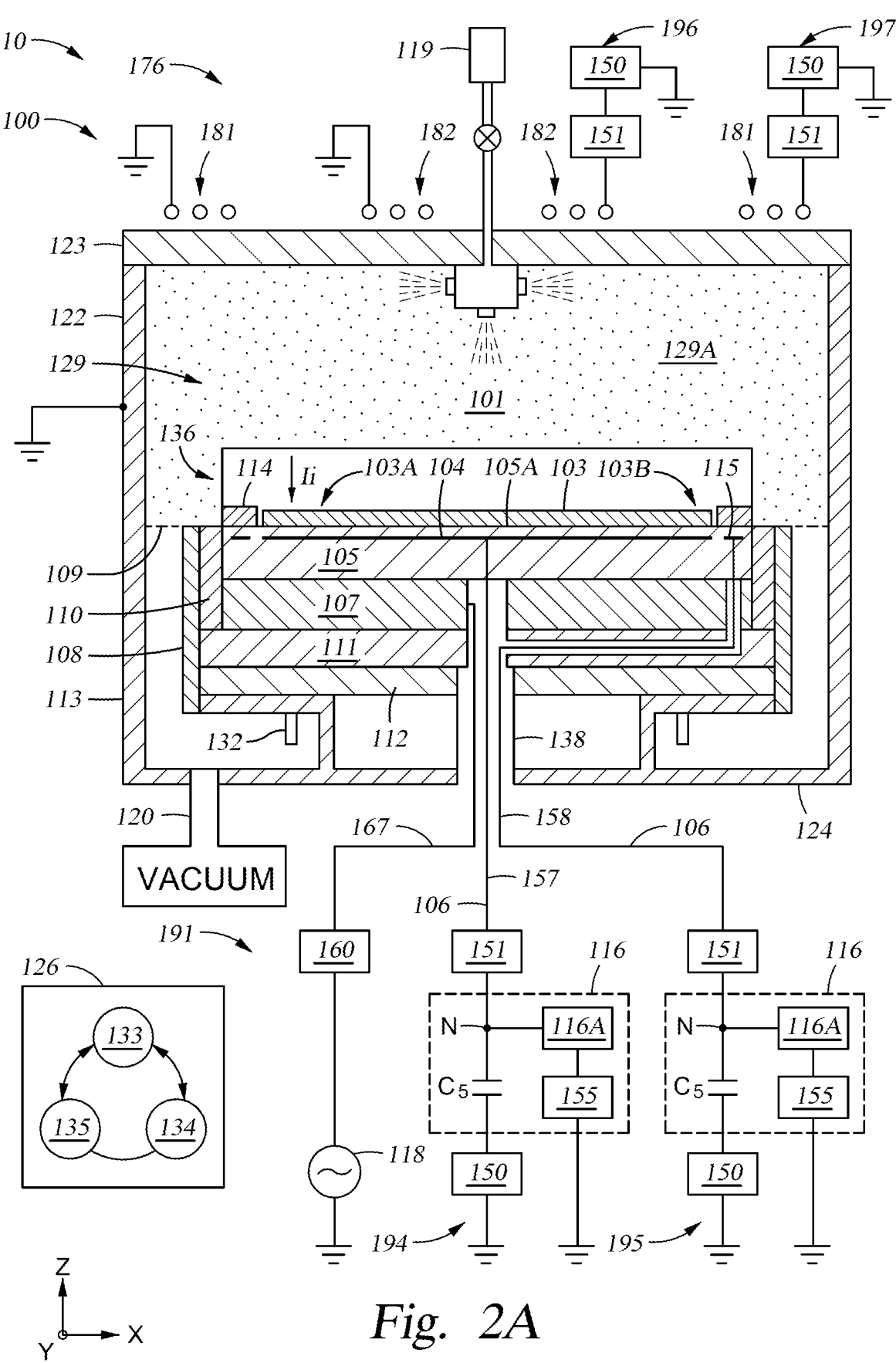
FIG. 2A is a schematic side cross-sectional view of a plasma processing system, according to one or more embodiments, configured to practice the methods set forth herein.

FIG. 2A is a schematic cross-sectional view of a processing system 10 that is configured to perform one or more of the plasma processing methods set forth herein. In some embodiments, the processing systems 10 is configured for plasma-assisted etching processes, such as a reactive ion etch (RIE) plasma processing. However, it should be noted that the embodiments described herein may be also be used with processing systems configured for use in other plasma-assisted processes, such as plasma-enhanced deposition processes, for example, plasma-enhanced chemical vapor deposition (PECVD) processes, plasma-enhanced physical vapor deposition (PEPVD) processes, plasma-enhanced atomic layer deposition (PEALD) processes, plasma treatment processing or plasma-based ion implant processing, for example, plasma doping (PLAD) processing.

Figure 2B:
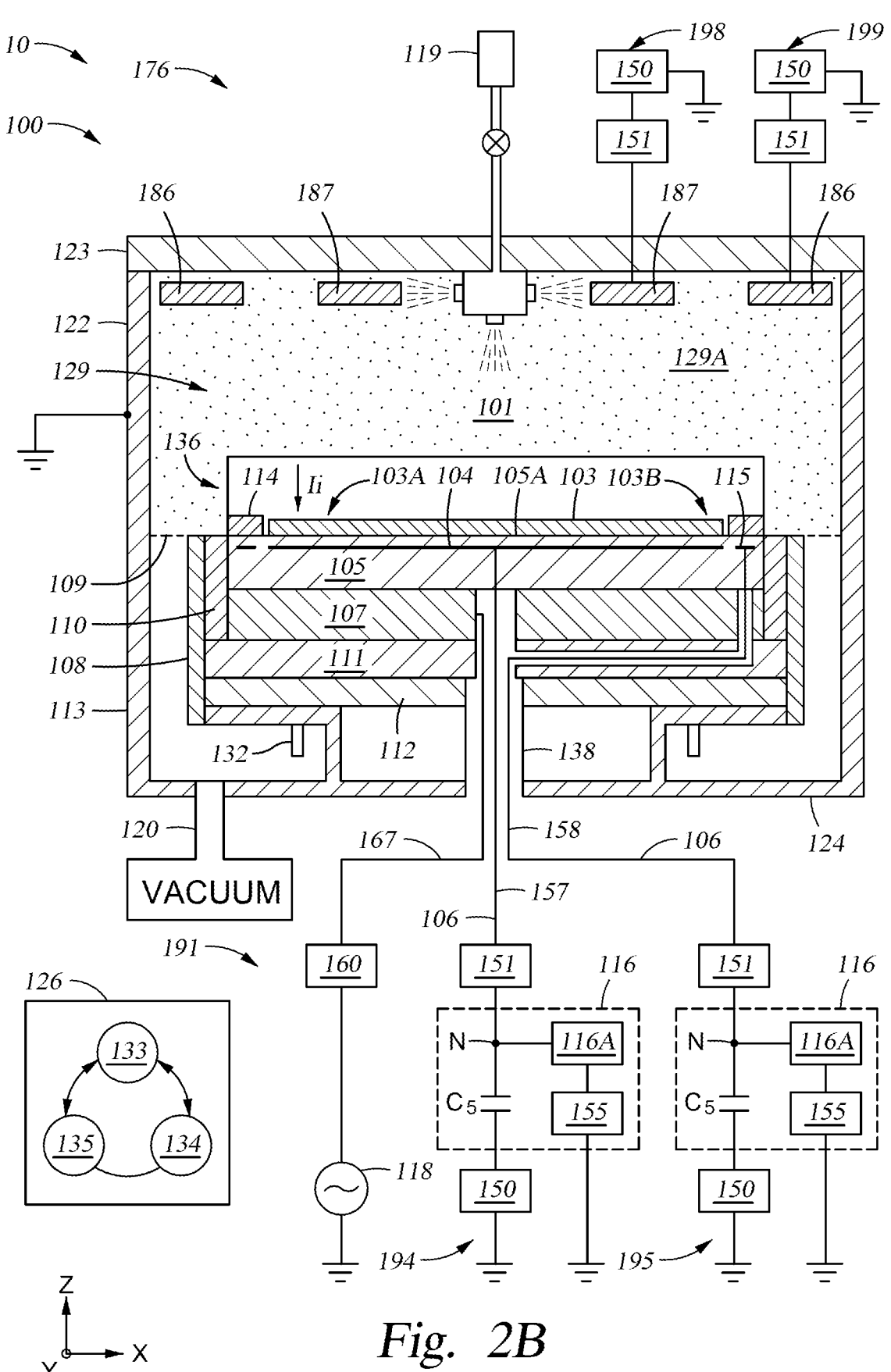
FIG. 2B is a schematic side cross-sectional view of a plasma processing system, according to one or more embodiments, configured to practice the methods set forth herein.

The processing system 10 generally includes a processing chamber 100, a lid assembly 176, a support assembly 136, and a system controller 126. As shown, the processing system 10 includes a plurality of plasma source assemblies that are each adapted to deliver an asymmetric voltage waveform to one or more electrodes and/or one or more coils disposed within the processing chamber 100. In one configuration example, as shown in FIG. 2A, the processing chamber 100 includes four plasma source assemblies, such as a first capacitively coupled plasma (CCP) assembly 194, a second capacitively coupled plasma (CCP) assembly 195, a first inductively coupled plasma (ICP) assembly 196, and a second inductively coupled plasma (ICP) assembly 197 that each include a pulsed voltage (PV) waveform generator 150 that is adapted to deliver an asymmetric voltage waveform, which is described in more detail below. In another configuration example, as shown in FIG. 2B, the processing chamber 100 includes a first capacitively coupled plasma (CCP) assembly 194, a second capacitively coupled plasma (CCP) assembly 195, a third capacitively coupled plasma (CCP) assembly 198, and a fourth capacitively coupled plasma (CCP) assembly 199 that each include a pulsed voltage (PV) waveform generator 150 that is adapted to deliver an asymmetric voltage waveform.

The processing chamber 100 typically includes a chamber body 113 that includes one or more sidewalls 122 and a chamber base 124, which collectively, with the chamber lid 123 of the lid assembly 176, define the processing volume 129. The one or more sidewalls 122 and chamber base 124 generally include materials that are sized and shaped to form the structural support for the elements of the processing chamber 100 and are configured to withstand the pressures and added energy applied to them while a plasma 101 is generated within a vacuum environment maintained in the processing volume 129 of the processing chamber 100 during processing. In one example, the one or more sidewalls 122 and chamber base 124 are formed from a metal, such as aluminum, an aluminum alloy, or a stainless steel alloy. A gas inlet 128 disposed through the chamber lid 123 is used to deliver one or more processing gases to the processing volume 129 from a processing gas source 119 that is in fluid communication therewith. A substrate 103 is loaded into, and removed from, the processing volume 129 through an opening (not shown) in one of the one or more sidewalls 122, which is sealed with a slit valve (not shown) during plasma processing of the substrate 103.

The system controller 126, also referred to herein as a processing chamber controller, includes a central processing unit (CPU) 133, a memory 134, and support circuits 135. The system controller 126 is used to control the process sequence used to process the substrate 103, including the substrate biasing methods described herein. The CPU 133 is a general-purpose computer processor configured for use in an industrial setting for controlling the processing chamber and sub-processors related thereto. The memory 134 described herein, which is generally non-volatile memory, may include random access memory, read-only memory, floppy or hard disk drive, or other suitable forms of digital storage, local or remote. The support circuits 135 are conventionally coupled to the CPU 133 and comprise cache, clock circuits, input/output subsystems, power supplies, and the like, and combinations thereof. Software instructions (program) and data can be coded and stored within the memory 134 for instructing a processor within the CPU 133. A software program (or computer instructions) readable by CPU 133 in the system controller 126 determines which tasks are performable by the components in the processing system 10. Typically, the software program, which is readable by CPU 133 in the system controller 126, includes code, which, when executed by the processor (CPU 133), performs tasks relating to the plasma processing methods described herein. The program may include instructions that are used to control the various hardware and electrical components within the processing system 10 to perform the various process tasks and various process sequences used to implement the methods described herein.

In some embodiments, the lid assembly 176 includes a chamber lid 123 and the one or more plasma source assemblies, such as two inductively coupled plasma (ICP) assemblies 196, 197 illustrated in FIG. 2A. As shown in FIG. 2A, each ICP assembly 196, 197 includes a coil 181, 182, respectively, that is configured to inductively couple a PV waveform generated by a PV waveform generator 150 to a plasma 101 formed in the processing volume 129 of the processing chamber 100 during plasma processing. In this configuration, the chamber lid 123 includes a dielectric material that is configured to allow the fields generated by the coils 181, 182 during the delivery of an asymmetric voltage waveform by the PV waveform generator 150 to help generate and sustain the plasma 101 in the processing volume 129.

In some other embodiments, as shown in FIG. 2B, the lid assembly 176 includes the chamber lid 123 and one or more of the capacitively coupled plasma (CCP) assemblies, such as the two capacitively coupled plasma (CCP) assemblies 198, 199 illustrated in FIG. 2B. As shown in FIG. 2B, each CCP assembly 198, 199 includes an electrode 186, 187, respectively, that is configured to capacitively couple a PV waveform generated by a PV waveform generator 150 to a plasma 101 formed in the processing volume 129 of the processing chamber 100 during plasma processing. In this configuration, the chamber lid 123 can include a dielectric material or structural material (e.g., metal) that is configured to withstand the vacuum created in the processing volume 129 during processing.

The substrate support assembly 136, as shown in FIGS. 2A-2B, includes a substrate support 105 (e.g., ESC substrate support) and one or more lower electrodes, which are coupled to a plasma source, such as the capacitively coupled plasma (CCP) assemblies 194, 195. In some embodiments, the substrate support assembly 136 can additionally include a support base 107, an insulator plate 111 and a ground plate 112. The support base 107 is electrically isolated from the chamber base 124 by the insulator plate 111, and the ground plate 112 is interposed between the insulator plate 111 and the chamber base 124. The substrate support 105 is thermally coupled to and disposed on the support base 107. In some embodiments, the support base 107 is configured to regulate the temperature of the substrate support 105, and the substrate 103 disposed on the substrate support 105, during substrate processing. Typically, the substrate support 105 is formed of a dielectric material, such as a bulk sintered ceramic material, such as a corrosion-resistant metal oxide or metal nitride material, for example, aluminum oxide $(Al_2O_3)$, aluminum nitride (AlN), titanium oxide (TiO), titanium nitride (TiN), yttrium oxide $(Y_2O_3)$, mixtures thereof, or combinations thereof. In embodiments herein, the substrate support 105 further includes the bias electrode 104 embedded in the dielectric material thereof.

The one or more lower electrodes can include a bias electrode 104 and/or an edge electrode 115 that are formed within the substrate support 105, and are coupled to one or more plasma source assemblies, such as the capacitively coupled plasma (CCP) assemblies, such as the two CCP assemblies 194, 195. The CCP assembly 194 is coupled to the bias electrode 104 and the CCP assembly 195 is coupled to the edge electrode 115, and are each configured to deliver a PV waveform generated by a PV waveform generator 150 to a plasma 101 formed in the processing volume 129 of the processing chamber 100 during plasma processing. In one embodiment, which is not shown in FIGS. 2A-2B, a first PV waveform generator 150 of first CCP assembly 194 is configured to bias both the bias electrode 104 and the edge control electrode 115, and thus the CCP assembly 195 and its components are not needed to deliver PV waveforms to the bias electrode 104 and the edge control electrode 115.

In one configuration, the bias electrode 104 is a chucking pole used to secure (i.e., chuck) the substrate 103 to the substrate supporting surface 105A of the substrate support 105 and to bias the substrate 103 with respect to the processing plasma 101 using one or more of the pulsed-voltage biasing schemes described herein. Typically, the bias electrode 104 is formed of one or more electrically conductive parts, such as one or more metal meshes, foils, plates, or combinations thereof.

The CCP assemblies 194, 195 may also each include a clamping network 116 so that a high voltage bias applied to the bias electrode 104 and/or edge control electrode 115. In some embodiments, the bias electrode 104 is electrically coupled to a clamping network 116 and the edge electrode 115 is electrically coupled to a clamping network 116. The clamping networks provide a chucking voltage thereto, such as static DC voltage between about −5000 V and about +5000 V, using an electrical conductor, such as the coaxial power delivery line 106 (e.g., a coaxial cable). The clamping network 116 includes bias compensation circuit elements 116A, a DC power supply 155, and a bias compensation module blocking capacitor, which is also referred to herein as the blocking capacitor $C_5$. The blocking capacitor $C_5$ is disposed between the output of a pulsed voltage (PV) waveform generator 150 and the bias electrode 104. Applying similarly configured PV waveforms and clamping voltages to the bias electrode 104 and edge control electrode 115 can help improve the plasma uniformity across the surface of the substrate during processing and thus improve the plasma processing process results.

As discussed above, in some embodiments, the substrate support assembly 136 include the edge control electrode 115 that is positioned below the edge ring 114 and surrounds the bias electrode 104 and/or is disposed a distance from a center of the bias electrode 104. In general, for a processing chamber 100 that is configured to process circular substrates, the edge control electrode 115 is annular in shape, is made from a conductive material, and is configured to surround at least a portion of the bias electrode 104. In some embodiments, such as shown in FIGS. 2A-2B, the edge control electrode 115 is positioned within a region of the substrate support 105. In some embodiments, as illustrated in FIGS. 2A-2B, the edge control electrode 115 includes a conductive mesh, foil, and/or plate that is disposed a similar distance (i.e., Z-direction) from the substrate supporting surface 105A of the substrate support 105 as the bias electrode 104. In some other embodiments, the edge control electrode 115 includes a conductive mesh, foil, and/or plate that is positioned on or within a region of a quartz pipe 110, which surrounds at least a portion of the bias electrode 104 and/or the substrate support 105. Alternately, in some other embodiments (not shown), the edge control electrode 115 is positioned within or is coupled to the edge ring 114, which is disposed on and adjacent to the substrate support 105. In this configuration, the edge ring 114 is formed from a semiconductor or dielectric material (e.g., AlN, etc.).

A power delivery line 157 electrically connects the output of the PV waveform generator 150 of the CCP assembly 194 to an optional filter assembly 151 and the bias electrode 104. While the discussion below primarily discusses the power delivery line 157 of the first CCP assembly 194, which is used to couple a PV waveform generator 150 to the bias electrode 104, the power delivery line 158 of the CCP assembly 195, which couples a PV waveform generator 150 to the edge control electrode 115, will include the same or similar components. The electrical conductor(s) within the various parts of the power delivery line 157 may include: (a) one or a combination of coaxial cables, such as a flexible coaxial cable that is connected in series with a rigid coaxial cable, (b) an insulated high-voltage corona-resistant hookup wire, (c) a bare wire, (d) a metal rod, (e) an electrical connector, or (f) any combination of electrical elements in (a)-(e). The optional filter assembly 151 includes one or more electrical elements that are configured to substantially prevent a current generated by one or more of the plasma sources from flowing through the power delivery line 157 and damaging the PV waveform generator 150.

In some embodiments, the processing chamber 100 further includes the quartz pipe 110, or collar, that at least partially circumscribes portions of the substrate support assembly 136 to prevent the substrate support 105 and/or the support base 107 from contact with corrosive processing gases or plasma, cleaning gases or plasma, or byproducts thereof. Typically, the quartz pipe 110, the insulator plate 111, and the ground plate 112 are circumscribed by a liner 108. In some embodiments, a plasma screen 109 is positioned between the cathode liner 108 and the sidewalls 122 to prevent plasma from forming in a volume underneath the plasma screen 109 between the liner 108 and the one or more sidewalls 122.

Figure 2C:
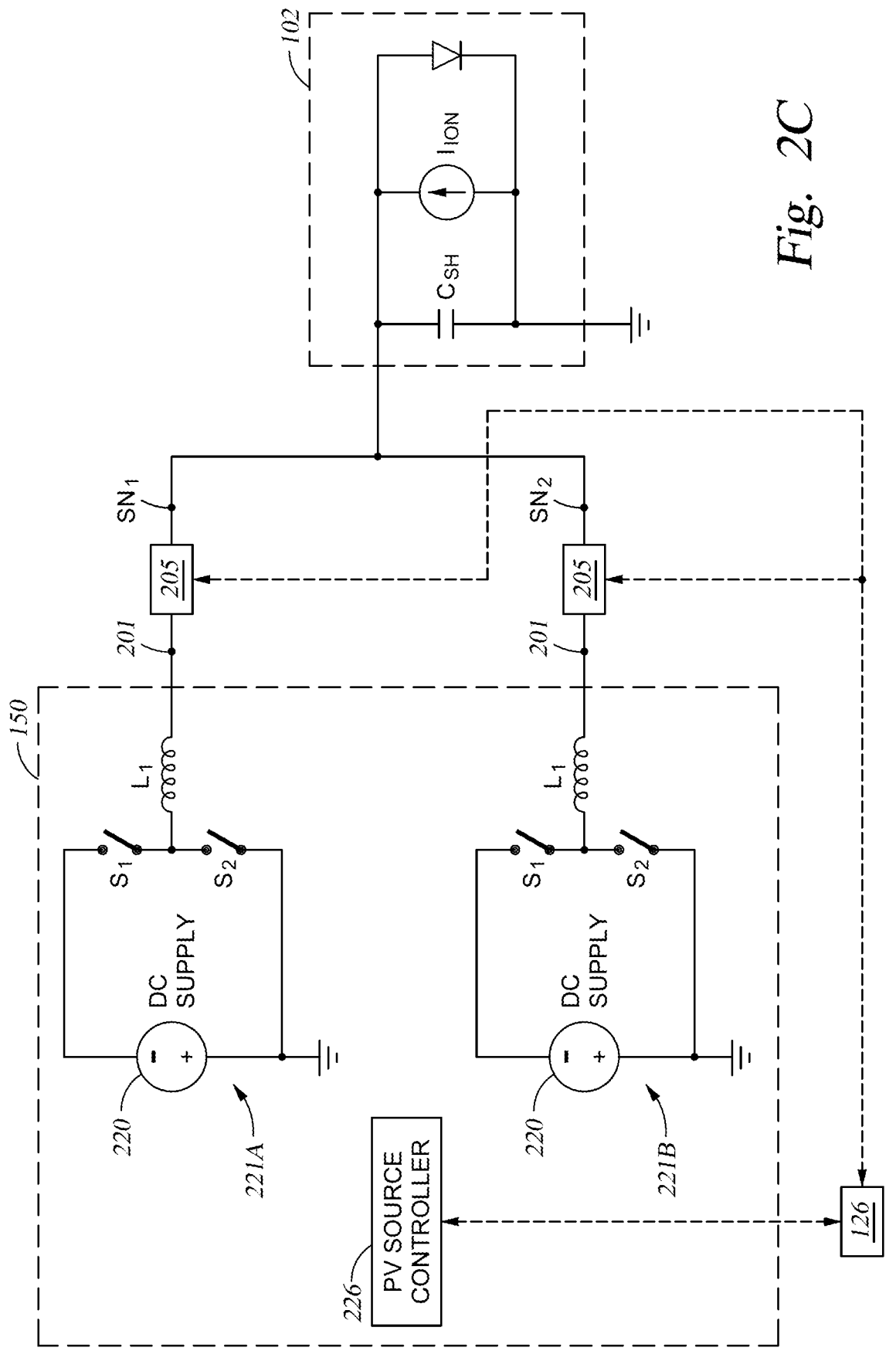
FIG. 2C is a simplified schematic of a pulsed voltage (PV) waveform generator in connection with a control system that can be configured to practice the methods set forth herein, according to one or more embodiments.

In some embodiments, a PV waveform generator 150 can be adapted to provide a voltage waveform to a plurality of electrodes and/or coils within the processing chamber 100. In some cases, the PV waveform generator 150 can be used within one or more of the plasma source assemblies 194-199. A PV waveform generator 150 will typically include a PV source controller 226 and at least one voltage source assembly that includes a voltage source 220 that is configured to provide a PV waveform to at least one generator output 201 that is coupled to one or more of the electrodes and/or coils. In one example, as shown in FIG. 2C, the PV waveform generator 150 includes a PV source controller 226 and two voltage source assemblies 221A, 221B that are configured to provide a PV waveform to two separate generator outputs 201. The two separate generator outputs 201 can be coupled to two source nodes $SN_1$ and $SN_2$ that are coupled to the bias electrode 104, edge electrode 115, an electrode 186, 187 or a coil 181, 182 that is capacitively or inductively coupled to the complex load 102. In some configurations, the PV waveform generator 150 includes three or more voltage source assemblies that are configured to provide a PV waveform to three or more separate generator outputs 201. The complex load 102 is shown as a standard electrical plasma model that represents the plasma 101 as three circuit elements. The three circuit elements include: (a) a diode, (b) a current source lion, and (c) the capacitor $C_{SH}$, which are each present during the delivery of at least a portion an asymmetric voltage waveform that are provided to an electrode or coil by the PV waveform generator 150 during a plasma process. In some embodiments, the PV waveform generator 150 is a switch-mode power supply. In some embodiments, each of the PV waveform generators 150 are configured to deliver between 10 and 25 kilowatts (kW) of DC power to an electrode or coil.

Referring to FIG. 2C, the two switches S1 and S2 within each of the voltage source assemblies 221A, 221B are coupled to and in communication with the PV source controller 226 to enable the PV source controller 226 to separately open and close the switches, S1, S2 of each two voltage source assemblies 221A, 221B at desirable intervals to form the asymmetric voltage waveforms, as disclosed below. The depicted switches S1, S2 in each of each of the voltage source assemblies 221A, 221B can be realized by single pole, single throw, normally open switches that are controllable by an electrical or optical signal provided by the PV source controller 226, or MOSFET devices who's gates are controlled from signals provided by the PV source controller 226. The PV source controller 226 is also configured to control and/or adjust the voltage level generated by each of the voltage sources 220 (e.g., DC supplies) and provided to the generator output 201A, 201B based on commands received from the system controller 126. In some embodiments, the PV source controller 226 is in direct communication (not shown) with the various asymmetric voltage waveform generating components within each of the voltage source assemblies of the PV waveform generator 150, such as the switches, S1, S2 and voltage sources 220A, 220B in each of the voltage source assemblies 221A, 221B shown in FIG. 2C, so that the asymmetric voltage waveforms provided to the generator outputs by the voltage source assemblies can be synchronized at much smaller time scales (e.g., nanosecond or microsecond scales). The improved ability to synchronize the various asymmetric voltage waveforms at smaller time scales is generally due to the direct communication signals (e.g., TTL signals, analog signals, etc.) provided between the waveform generating components in voltage source assemblies 221A, 221B versus the need to transfer synchronizations signals between separate conventional power supplies that utilize a conventional communication protocol, such as an Ethernet protocol, to communicate.

In one or more of the embodiments disclosed herein, a PV waveform generator 150 includes a sensor assembly 205 that is positioned to measure characteristics of the PV waveform generated at one or more of the generator outputs 201A, 201B. The sensor assembly 205 can include one or more electrical components that are configured to measure one or more electrical characteristics of the asymmetric voltage waveform provided by the PV waveform generator 150, such as voltage, current and offset/phase, and send the one or more electrical characteristic data to the system controller 126. The electrical characteristic data received by the system controller 126 from each of the PV waveform generator 150 can be used together to synchronize the delivery of other PV waveforms generated by each of the generator outputs 201 of the PV waveform generator 150 and control characteristics of the PV waveforms generated by each of the PV waveform generators 150, as is discussed further below.

The system controller 126 and supporting circuitry are thus configured to control and/or adjust the voltage waveforms generated by the PV waveform generators 150. The PV waveform generators 150, system controller 126 and supporting circuitry are able to adjust multiple electrical parameters that are used to alter one or more of the voltage waveform characteristics, such as frequency, waveform shape, and applied voltage on-time during a pulse period of a provided asymmetric voltage waveform. In one example of the multiple electrical parameters that are used to alter one or more of the voltage waveform characteristics include, but are not limited to, are the direction of a current that flows through the electrode or coil during the delivery of a portion of the voltage waveform, altering the voltage ratio between electrodes or coils, and adjusting a delay in time in delivery of one or more pulses formed within the voltage waveforms provided by different PV waveform generators 150.

In some embodiments, the processing chamber 100 optionally includes a plasma ignition system 191 that is configured to deliver a DC high voltage or an RF signal to an electrode within the processing chamber 100, such as the support base 107 to initially generate (e.g., ignite) the plasma 101 in a processing volume 129. In some embodiments, the plasma ignition system 191 includes an RF generator 118 that is configured to deliver an RF waveform signal having a frequency that is greater than 1 MHz or more, or about 2 MHz or more, such as about 13.56 MHz or more through an RF match 160 that is connected to the RF electrode. In some embodiments, due to the undesirable effect created by the interaction between the asymmetric voltage waveforms provided by one or more of the plasma source assemblies 194-199 and the RF waveform provided by the RF generator 118 of the plasma ignition system 191, the RF waveform signal is only provided to the RF electrode for a very short interval during the initial generation of the plasma 101 in the processing volume 129.

Plasma Processing Method Examples

Figure 3A:
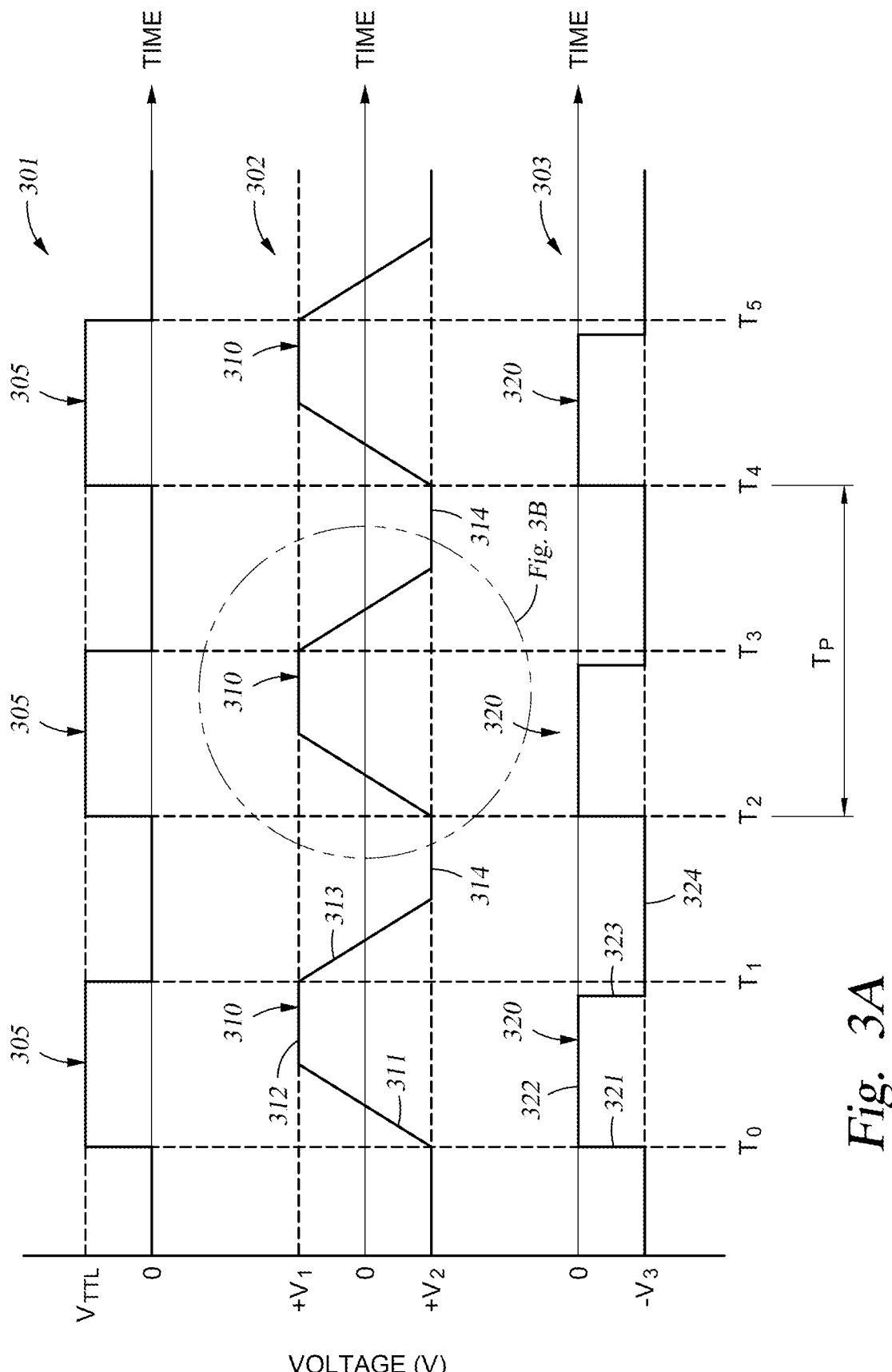
FIG. 3A illustrates a synchronization waveform and generated voltage waveforms that are utilized during one or more methods described herein, according one or more embodiments of the disclosure provided herein.
Figure 3B:
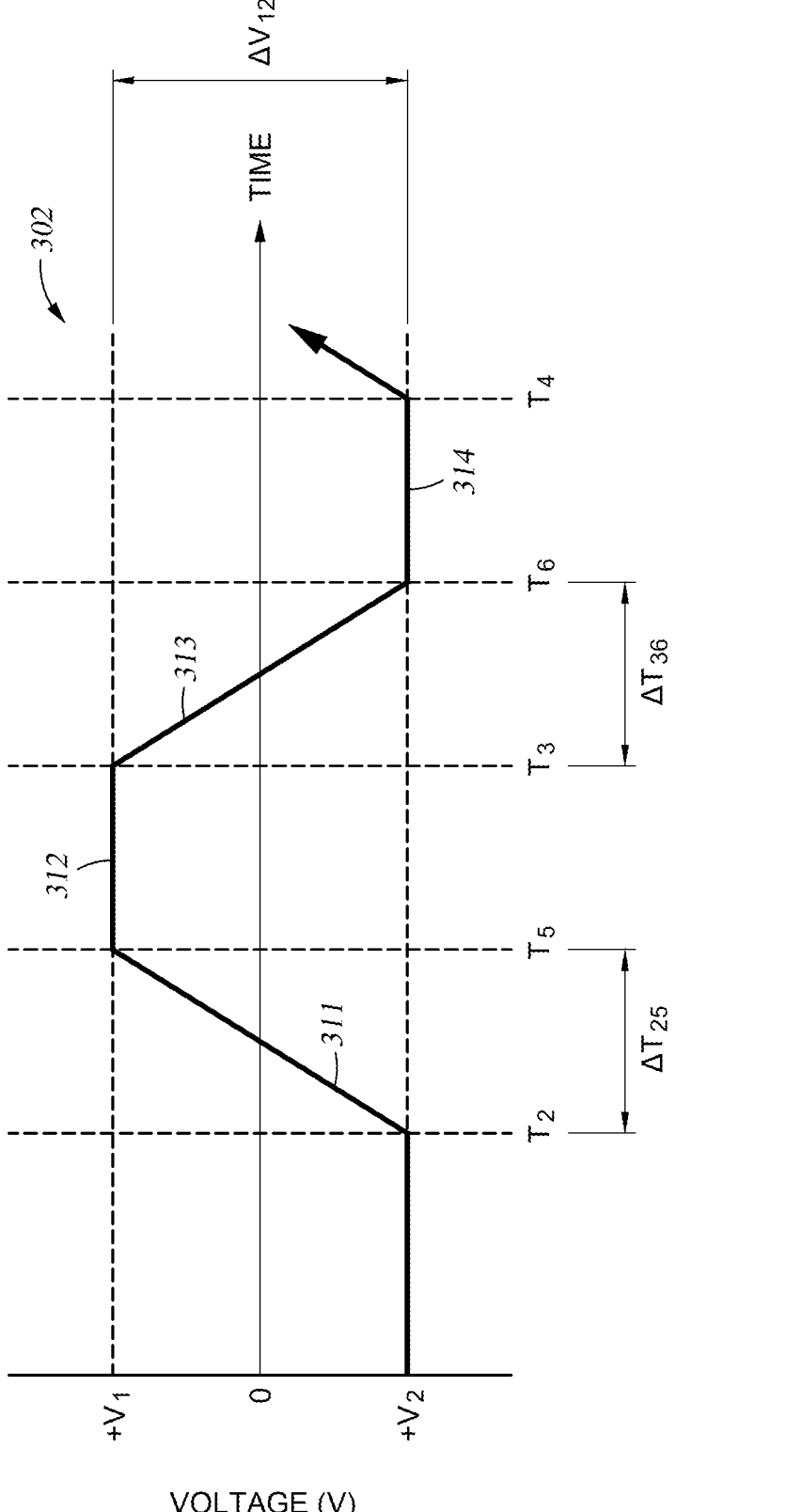
FIG. 3B is a close-up of a generated voltage waveform illustrated in FIG. 3A, according one or more embodiments of the disclosure provided herein.
Figure 3C:
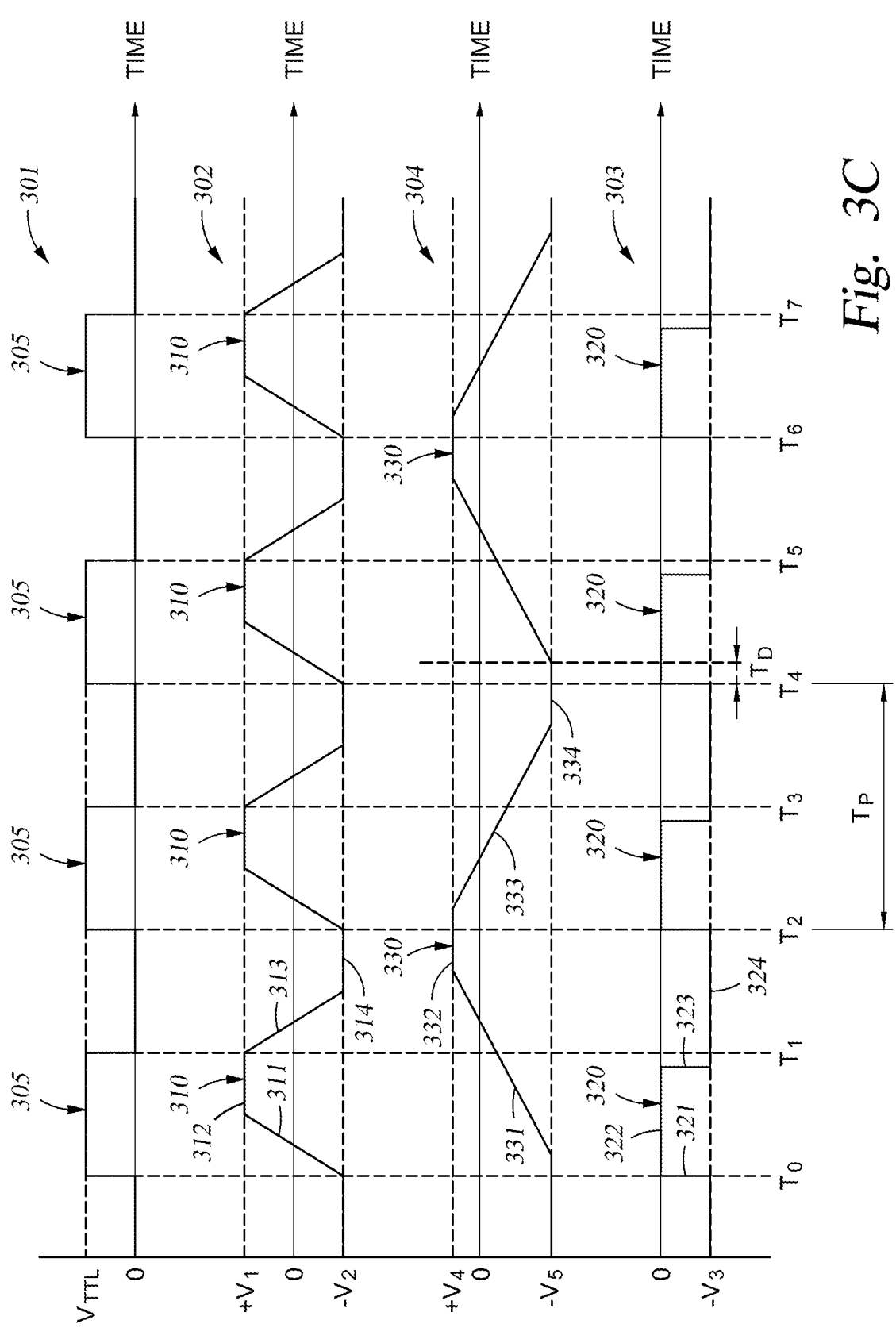
FIG. 3C illustrates a synchronization waveform and generated voltage waveforms that are utilized during one or more methods described herein, according one or more embodiments of the disclosure provided herein.
Figure 4:
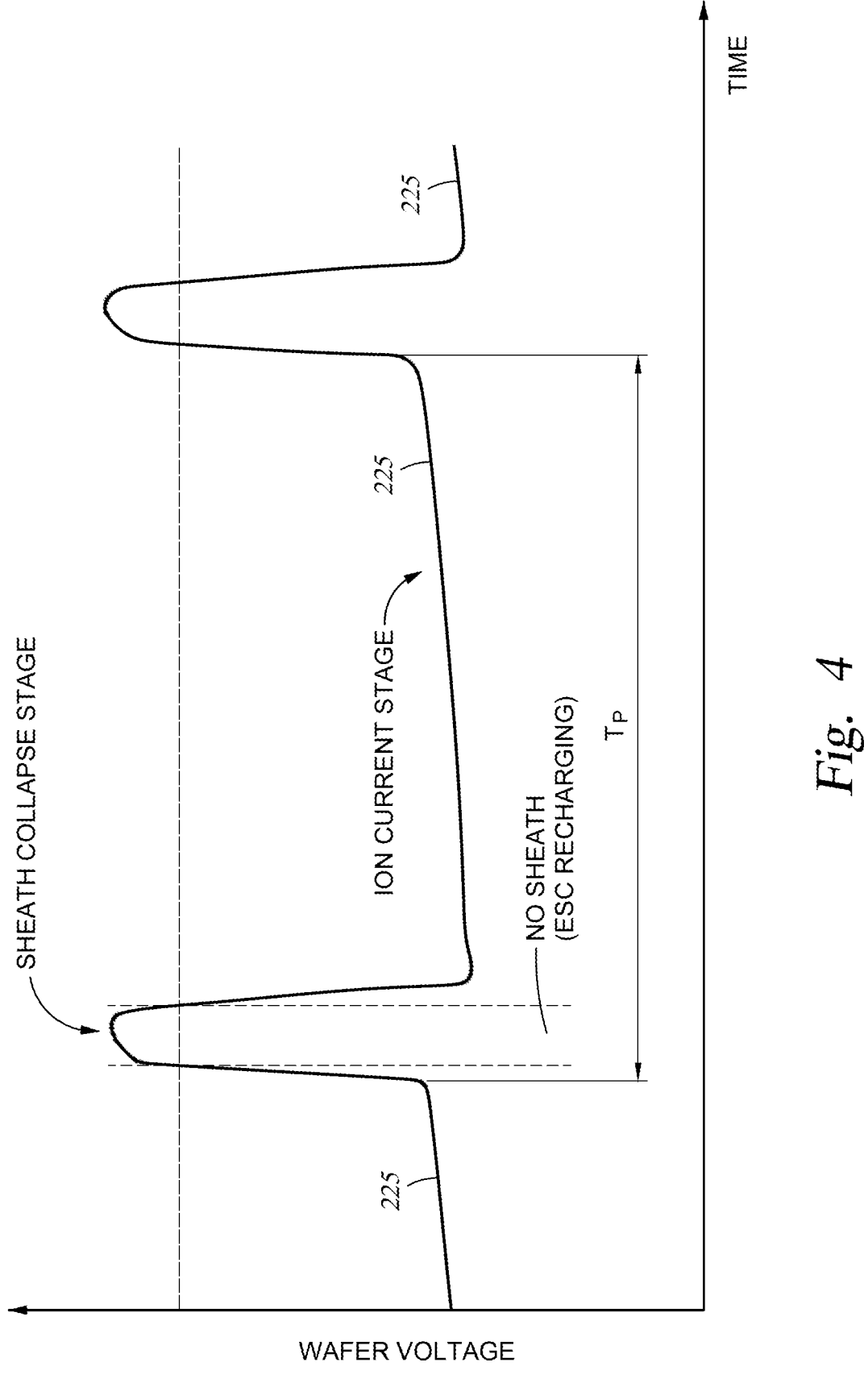
FIG. 4 illustrates an example of a voltage waveform in accordance with certain embodiments of the present disclosure.

FIG. 3A illustrates an example voltage waveforms 302 and 303 that are provided from two plasma source assemblies to one or more electrodes and/or one or more coils positioned within a plasma processing chamber. FIG. 3B is a close-up view of a portion of the voltage waveform 302 shown in FIG. 3A. FIG. 3C illustrates an example voltage waveforms 302, 303 and 304 that are provided from three plasma source assemblies to one or more electrodes and/or one or more coils positioned within the plasma processing chamber. FIG. 4 illustrates an example of a voltage waveform that is established at a surface of a substrate during plasma processing based on the delivery of the waveform 303 to an electrode (e.g., bias electrode 104) disposed within a substrate support, in accordance with certain embodiments of the present disclosure. During plasma processing, the voltage waveforms, such as voltage waveforms 302 and 303, can be synchronized by use of a synchronization signal 301, which includes a plurality of signal pulses 305 that are provided to each of the of the PV waveform generators 150 from the system controller 126 or from one or more of the PV waveform generators 150 within one of plasma source assemblies. In one example, the waveform 302 and waveforms 302 and 304 in FIGS. 3A and 3C, respectively, are generated by use of one or more ICP source assemblies, such as ICP source assemblies 196 and 197. It is believed that the delivery of asymmetric voltage pulses to inductive sources, such as coils 181, 182 can be used to more precisely control the plasma generated in the processing volume 129 of the processing chamber versus conventional inductively coupled plasma source designs. While FIGS. 3A-3B and 3C, and their related discussion provided below, describe a configuration in which two plasma source assemblies or three plasma source assemblies are used to deliver asymmetric voltage waveforms to electrodes or coils within upper and lower portions of a plasma processing chamber this configuration is not intended to be limiting as to the scope of the disclosure provided therein since any number of plasma sources, electrodes and/or coils can be positioned within desired portions of the plasma processing chamber without deviating from the scope of the disclosure provided herein. As discussed further below, the ability to adjust and synchronize the delivery of a voltage waveform that includes asymmetric voltage pulses to different coils or regions of a coil can be used to adjust one or more plasma characteristics, such as plasma density and spatial plasma uniformity.

It is believed that by use of the asymmetric voltage waveform producing plasma source assemblies disclosed herein that characteristics of a generated plasma can be controlled with better precision and fidelity. The improved control and fidelity is believed to be in part due to the ability of the PV waveform generator in each plasma source assembly to make nanosecond level adjustments to a delivered voltage waveform, such as adjustments to the pulse shape (e.g., voltage magnitude), the pulse on-time/duty cycle, the pulse frequency and the rate of change of the voltage (dV/dt), which are used to control plasma uniformity, plasma density and allow fast synchronization of voltage waveforms created by the PV waveform generators during plasma processing. While not intending to limit the disclosure provided herein, as a comparison, it is believed that current conventional plasma processing systems that utilize RF matching and RF generator components are limited to synchronization speeds that are on a 0.1 seconds (s) to 1 millisecond (ms) (i.e., 10 to 1000 Hz) scale, while the configuration(s) disclosed herein that do not include or utilize these components during plasma processing are able to achieve 1) waveform synchronization speeds that are at least less than 10 microseconds (µs), such as 2.5 µs or less, and 2) achieve voltage waveform adjustment speeds that are on the nanosecond scale.

In one processing example, the waveform 302 is generated due to the application of a voltage waveform by the PV waveform generator 150 of the first ICP assembly 196, and the waveform 303 is generated due to the application of a waveform by the PV waveform generator 150 of the first CCP assembly 194. As shown in FIGS. 3A, 3B and 3C, the waveform 302 includes a series of pulses 310 that each have a period $T_p$. However, for plasma processing results reasons and to allow for the synchronization of the voltage waveforms provided by each of the plasma source assemblies it may also be desirable for the periods $T_p$ of the applied voltage waveforms to be different and integer multiples of each other. In one example, as shown in FIG. 3C, a plurality of asymmetric voltage pulses in a first waveform 304, which are provided to a first coil 181, are delivered at a frequency of 200 kHz and a plurality of asymmetric voltage pulses in a second waveform 302, which are provided to a second coil 182, are delivered at a frequency of 400 kHz.

Due to preprogramed voltage waveform characteristics each of the voltage waveform pulses can include a plurality of segments or stages that are provided to an electrode or coil by the PV waveform generator 150 by use of commands received from the system controller 126 or provided from the PV source controller 226. In one example, as shown in FIG. 3A-3B, the pulses 310 each include a first stage 311, a second stage 312, a third stage 313 and a fourth stage 314. In this example, stages 311 and 313 include voltage ramps that vary from one voltage level V1 to another voltage level V2, and stages 312 and 314 include portions of the voltage waveform 302 that are maintained at a constant voltage for a period of time. It is believed that stages of a pulse that include a variation in voltage over time (i.e., dV/dt) can be used to control and adjust the real time and average plasma density generated in a plasma processing chamber. The plasma density can be altered by adjusting the slope of the slope (e.g., $\Delta V_{12}/\Delta T_{25}$ and $\Delta V_{12}/\Delta T_{36}$ in FIG. 3B) of the waveform and length of time that the varying voltage is applied (e.g., $\Delta T_{25}$, $\Delta T_{36}$ in FIG. 3B), since the ability of the electrons generated within a plasma to be accelerated and the rate of electron collisions with various gas atoms or molecules within the processing volume 129 is primarily controlled during the portions of a voltage pulse in which there is a change in voltage over time. The ability of the system controller 126 and PV source assemblies to control the waveforms and thus plasma generation characteristics at different electrodes or coils within the processing volume 129 will allow the plasma uniformity within the processing volume 129 to be adjusted and controlled by synchronizing and adjusting the voltage waveforms applied to each electrode or coil so that the plasma uniformity and plasma density can be precisely controlled. The ability to perform nanosecond adjustments to the voltage waveform and allow for the rapid synchronization of the generated voltage waveforms applied by the plasma source assemblies can be used to improve the precision and fidelity of a plasma process over conventional plasma processing techniques, as discussed above. While stages 311 and 313 illustrate an example that includes a linear variation in the applied voltage over time, it is contemplated that the applied voltage that is applied during these stages may include non-linear curves that have a slope that varies as a function time (e.g., $dV/dt^2$) and thus may include exponential and a second, a third or higher order shaped curve.

Referring back to FIGS. 3A and 3B, stages 312 and 314 include portions of the voltage waveform 303 that are maintained at a constant voltage for a period of time, such as voltage V1 and voltage V2, respectively. Since these stages of a voltage pulse provide a constant voltage to the electrode or coil it is believed that they will allow some decay in the electron energy during these stages. However, these stages can be useful to help adjust the average electron temperature and plasma density by spacing out the stages that include a change in voltage over time. The duration of stages 312 and 314 will typically be small enough to assure that plasma is maintained and is not extinguished.

FIG. 3C illustrates three voltage waveforms 302, 303 and 304 that are provided from three plasma source assemblies to one or more electrodes and/or one or more coils positioned within the plasma processing chamber. During plasma processing, the waveforms 302, 303 and 304 can be synchronized by use of a synchronization signal 301. In one example, the waveforms 302 and 304 each include pulses 310 and 330, respectively, that each include a first stage 311, 331, a second stage 312, 332, a third stage 313, 333 and a fourth stage 314, 334. In this example, stages 311, 313, 331 and 334 include voltage ramps that vary between voltage levels V1 and V2 and V4 and V5, and stages 312, 332 314, and 334 include portions of the voltage waveforms 302, 304 that are maintained at a constant voltage for a period of time. In one configuration, the magnitude of the difference in voltage between voltage levels V1 and V2 and magnitude of the difference between V4 and V5 are different. In one example, the voltages V1 and V2 are set to +5 kV and −5 kV relative to ground, while voltages V4 and V5 are set to +500 V and −8 kV relative to ground. While FIGS. 3A and 3C illustrate waveforms 302 and 304 that vary between a positive voltage level and a negative voltage level this configuration is not intended to be limiting to the scope of the disclosure provided herein, since the voltage levels between which the waveforms 302, 304 vary can both be negative or both be positive without deviating from the basic scope of the disclosure provided herein. As shown in FIG. 3C, the waveform 304 includes two pulses 330 that include a first stage 331, a second stage 332, a third stage 333 and a fourth stage 334 that have a period that is twice the period of each pulse 310 found in the waveform 302. In one embodiment, the waveform 304 is also offset a first amount in time $T_D$ from the start of the first stage 311 of the waveform 302, which creates a phase shift between the electrodes and coils that are each configured to receive the waveforms 302, 304. The ability to create a voltage signal phase shift between different coils or regions of a coil can be achieved by reversing the direction of the current flowing through the coils or regions of the coil, which can be used to adjust one or more plasma characteristics, such as spatial plasma uniformity. Moreover, by use of the PV waveform generators 150, one can apply a phase offset between the voltage waveforms applied to the inner and outer coils to be used in conjunction with coil current direction to provide a finer control over the plasma spatial distribution versus conventional RF techniques.

In one method example, the delivery of the waveform 303 (FIG. 3C) to an electrode within a substrate support assembly 136 is configured to create a waveform 225 (FIG. 4) that includes an ion current stage and a sheath collapse stage that is established at the surface of the substrate during plasma processing. At the beginning of the ion current stage, a drop of substrate voltage, which is created by the falling edge 323 of the waveform 303, creates a high voltage sheath to form above the substrate, accelerating positive ions to the substrate. The positive ions that bombard the surface of the substrate during the ion current stage deposit a positive charge on the substrate surface, which, if uncompensated, causes a gradual increase of the substrate voltage positively (i.e., positive slope during phase of the voltage waveform 225) during the ion current stage, as shown in FIG. 4. However, the uncontrolled accumulation of positive charge on the substrate surface undesirably gradually discharges the sheath and substrate support capacitors, slowly decreasing the sheath voltage drop and bringing the substrate potential closer to zero. The accumulation of positive charge results in the voltage droop (i.e., positive slope during phase) in the voltage waveform established at the substrate. The accumulation of positive charge on the substrate during the ion current stage can be compensated for by multiple techniques, which include adjusting the waveform 303 such that it has a negative slope (not shown) during the ion current portion 324 of the waveform 303. In some embodiments, a relatively high frequency voltage waveform may be used to lessen the impact of this voltage rise (i.e., droop) created during the ion current stage.

At the end of the ion current stage, and the start of the sheath collapse stage (e.g., sheath collapse portion 322), a rising edge 321 of the waveform 303 is created by the PV source assembly, which forms part of a typically short narrow positive pulse (FIG. 4) that transitions from a negative voltage level to a positive voltage that is greater than zero volts. The duration of the positive section of the pulse can be varied, and, in some embodiments, is between 1% and 20% of the waveform period ($T_P$), such as between 5% and 15% of the waveform period ($T_P$). In one example, the waveform period may be about 5 μs and the frequency of the waveform 303 may be about 200 kHz. In another example, the waveform period may be about 2.5 μs and the frequency of the waveform 303 is about 400 kHz.

Waveform Examples

Figure 5A:
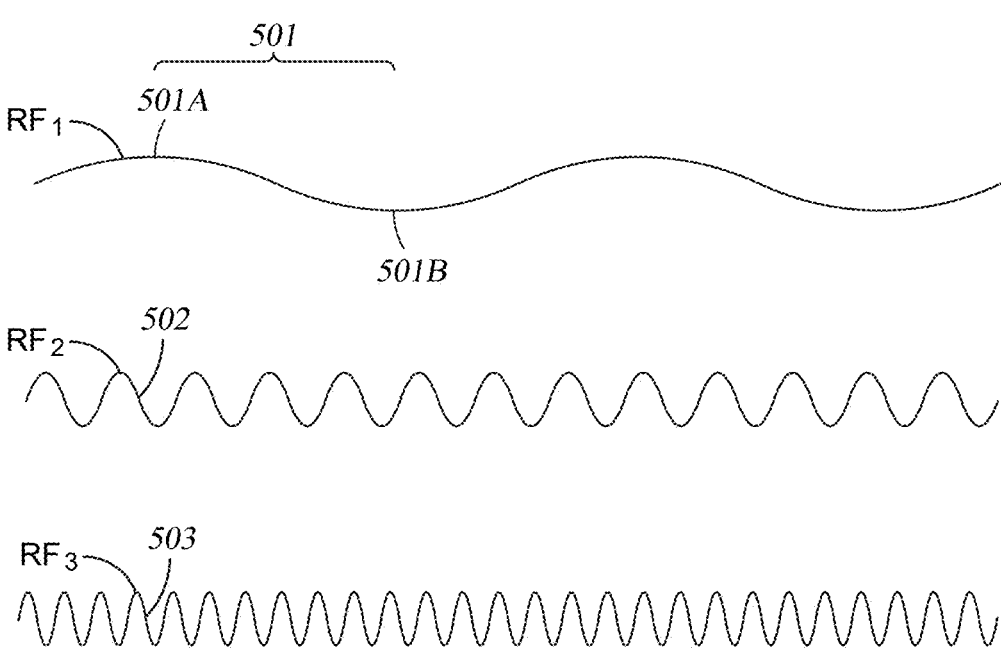
FIG. 5A illustrates three different conventional sinusoidal waveforms that each have a different frequency.
Figure 5B:
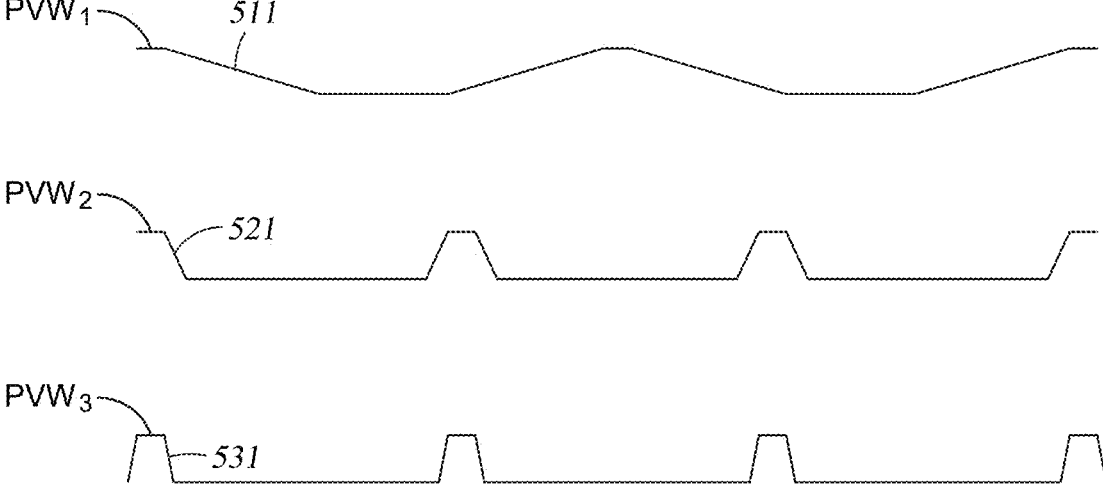
FIG. 5B illustrates three generated voltage waveforms that are each configured to replace one of the corresponding sinusoidal waveforms shown in FIG. 5A during processing, according one or more embodiments of the disclosure provided herein.

FIG. 5A illustrates three different conventional sinusoidal waveforms $RF_1$, $RF_2$ and $RF_3$ that each have a different sinusoidal waveform frequency. In one example, the sinusoidal waveforms $RF_1$, $RF_2$ and $RF_3$ are RF waveforms that have a frequency of 2 MHz, 13.56 MHz and 40 MHz, respectively. FIG. 5B illustrates three generated voltage waveforms that are each configured to replace one of the corresponding sinusoidal waveforms shown in FIG. 5A during processing, according one or more embodiments of the disclosure provided herein. As noted above, due to practical limitations in available voltage waveform generating hardware today, which prevents the generation of asymmetric voltage waveforms that have a period that are less than about 2 μs (>500 kHz), it is not possible to generate voltage waveforms that have frequencies in the more common and desirable RF frequency ranges today, such as frequencies greater 2 MHz, or greater than 13.56 MHz, such as 40 MHz and above. As discussed previously, it is believed that stages of a waveform that include a variation in voltage over time (i.e., dV/dt) can be used to control and adjust the real time and average plasma density generated in a plasma processing chamber. The plasma density can be altered by adjusting the slope of the voltage waveform and length of time that the varying voltage is applied, since the ability to be accelerate electrons and increase the rate of electron collisions with gas atoms or molecules within a plasma is believed to be controlled by the sections of a voltage pulse where the voltage is changing over time.

Referring to FIG. 5B, the three voltage waveforms $PVW_1$, $PVW_2$ and $PVW_3$ illustrate voltage waveforms that are designed to replace the conventional sinusoidal waveforms $RF_1$, $RF_2$ and $RF_3$ that are provided to the processing volume 129 of the plasma processing chamber 100 in a conventional processing sequence. The three voltage waveforms $PVW_1$, $PVW_2$ and $PVW_3$ can be provided from at least one plasma source assembly to one or more electrodes and/or one or more coils positioned within the plasma processing chamber. In some cases, each of the three voltage waveforms $PVW_1$, $PVW_2$ and $PVW_3$ can be provided from one plasma source assembly at different times within a plasma processing sequence. In some other cases, at least two of the three voltage waveforms $PVW_1$, $PVW_2$ and $PVW_3$ can be provided from at least two different plasma source assemblies at the same time within a plasma processing sequence. The three voltage waveforms $PVW_1$, $PVW_2$ and $PVW_3$ each include asymmetric pulses that each include at least one or more sloped regions during a section of each pulse period that is intended to simulate the one or more sloped regions of a sinusoidal waveform. In some embodiments, the simulated slope is selected so that it matches a slope of a sinusoidal waveform taken at a zero-crossing point of the sinusoidal waveform (e.g., angles 0, π, 2π, etc.). In one example, the region 511 of the voltage pulse $PVW_1$ is intended to simulate an average slope in the sloped region 501 of the sinusoidal waveforms $RF_1$ that extends between the peaks 501A and 501B. In another example, the region 521 of the voltage pulse $PVW_2$ is intended to simulate an average slope in the sloped region 502 of the sinusoidal waveforms $RF_2$. In yet another example, the region 531 of the voltage pulse $PVW_3$ is intended to simulate an average slope in the sloped region 503 of the sinusoidal waveforms $RF_3$. Due to hardware related limitations in the pulsed voltage (PV) waveform generator, the three voltage waveforms $PVW_1$, $PVW_2$ and $PVW_3$ each include voltage pulse periods that are longer than the period of typical desirable RF type sinusoidal waveforms used in common plasma processing recipes which they are intended to simulate. However, it is believed that by the incorporation of at least one simulated sloped region in a series of voltage pulses in a voltage waveform that has a pulse repetition frequency in the kilohertz range, such as between 100 and 500 kHz, is useful to achieve a similar effect on the control of the plasma properties as a higher frequency RF type sinusoidal waveform (e.g., >1 MHz) would have on the formed plasma. Typical, voltage pulse slope control provided by a PV waveform generator 150 can be performed in a range of 1 ns to 1000 ns, which is similar to the slope of the commonly desired RF center frequencies. In some embodiments, the first asymmetric voltage waveform includes a plurality of voltage pulses that each comprise a first pulse period and at least one sloped region that has first slope ($dV_1/dt$) that is intended to simulate a sinusoidal waveform. In this example, the first slope ($dV_1/dt$) can be equal to a slope of a sinusoidal waveform ($dV_S/dt$) when measured at a phase angle at which the sinusoidal waveform crosses zero in a time axis, and the sinusoidal waveform has a frequency that is between 1 MHz and 100 MHz, and a peak voltage between 100 volts and 5000 volts.

Figures 6A, 6B, 6C:
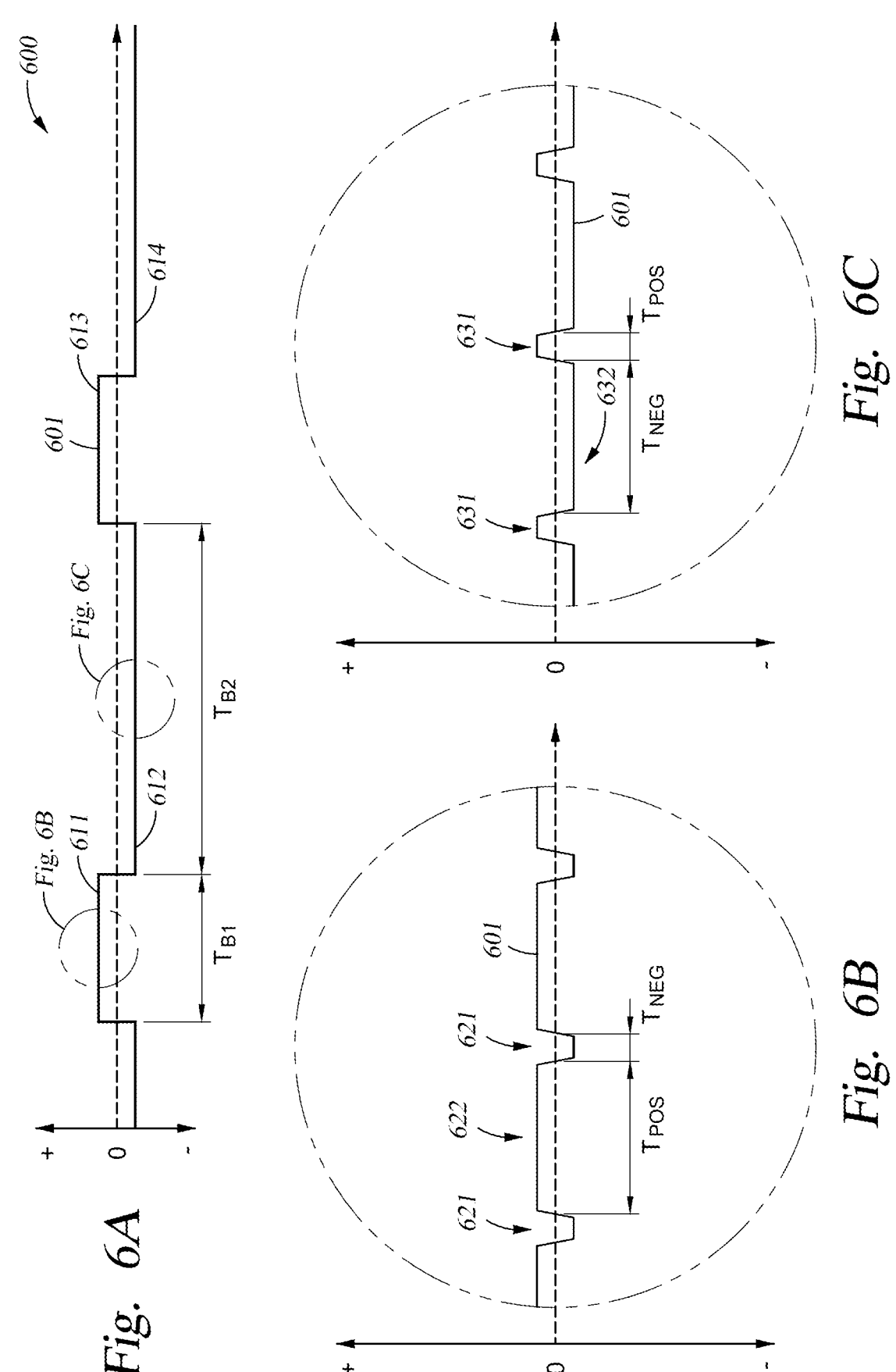
FIG. 6A illustrates bursts voltage pulses within a generated voltage waveform that are utilized during one or more methods described herein, according one or more embodiments of the disclosure provided herein.
FIGS. 6B and 6C illustrate zoomed-in detailed sections of the generated voltage waveform found within different portions of the bursts shown in FIG. 6A, according one or more embodiments of the disclosure provided herein.

FIG. 6A illustrates a voltage waveform 601 that includes a plurality of bursts of generated voltage waveform pulses that are utilized during one or more methods described herein, according one or more embodiments of the disclosure provided herein. As shown in FIG. 6A, the voltage waveform 601 includes a plurality of positive voltage waveform pulse bursts 611 and 613, and a plurality of negative voltage waveform pulse bursts 612 and 614 that each comprise a series of voltage pulses, which are illustrated in FIGS. 6B and 6C. FIGS. 6B and 6C illustrate zoomed-in detailed sections of the waveform pulse bursts 611 and 612, respectively, according one or more embodiments of the disclosure provided herein. During the positive voltage waveform pulse burst 611 and the negative voltage waveform pulse burst 612 the voltage waveform 601 includes a plurality of voltage pulses that each include a positive voltage section that extends over a period $T_{POS}$ and a negative voltage section that extends over a period $T_{NEG}$. The period $T_P$ of each voltage pulse is equal to the sum of time allotted to the positive voltage section plus negative voltage section (i.e., $T_P=T_{POS}+T_{NEG}$). If the positive and negative voltage swings found in voltage waveform 601 are equal in magnitude, such as shown in FIG. 6A, the percentage of time that the waveform generator is generating a positive or negative voltage during each voltage pulse period will determine if the waveform pulse bursts has a positive or negative bias. In one example, as shown in FIG. 6B, the positive section 622 of each pulse accounts for about 85% of the pulse period while negative section 621 of each pulse accounts for about 15%, and thus burst 611 can be characterized as being a positive biasing burst. In an alternate example, as shown in FIG. 6C, the positive section 631 of each pulse accounts for about 15% of the pulse period while negative section 632 of each pulse accounts for about 85%, and thus burst 612 can be characterized as being a negative biasing burst. The determination and delivery of a waveform pulse burst that has a positive or negative bias can also be controlled based on the area under the voltage waveform 601 curve during each section of a voltage pulse (i.e., magnitude of the voltage during a section of the period× time). It is believed that the ability to provide voltage pulses that have both positive and negative sections, and bursts of pulses that have both positive and negative sections at different voltage levels can be useful to control characteristics of the generated plasma, such as controlling the plasma density and energies of both positive and negative ions and electrons in the plasma. Therefore, if the duration and magnitude of a certain state ($T_{POS}$ or $T_{NEG}$) is higher in a burst, then plasma processing mechanism involving the oppositely charged species will be more dominant. For example, if the negative states in a burst are provided for a longer duration and/or with a higher voltage magnitude, plasma processing mechanisms involving positively charged ions will be more dominant versus negatively charged ions, and similarly the opposite is true for positive states in a burst that have a longer duration and/or higher voltage magnitude for negatively charged species versus positively charged ions. The ability to control the characteristics of both positive and negative ions formed in a plasma will provide an additional process control variable over conventional reactive ion etching (RIE) processes that control one type of ion (e.g., positively charged ions) and other useful processes that require the interaction of the plasma with a substrate and/or various component gases or reactive elements found within the processing region of a plasma processing chamber.

In some embodiments, voltage pulses found within two or more of the bursts of voltage waveform pulses include one or more different voltage pulse characteristics, such as voltage polarity (e.g., positive or negative), pulse period ($T_P$), a negative section period $T_{NEG}$, a positive section period $T_{POS}$, differing slopes in periods of transition between sections of a voltage pulse (e.g., regions 511, 521, 531), and/or other voltage waveform characteristic. The ability to control and deliver multiple different voltage waveform frequencies in different sections of a voltage waveform 601 allows additional process control flexibility that is not available in conventional sinusoidal waveform processing systems without the use of and expense of utilizing multiple waveform generating sources that are each configured to deliver different fundamental sinusoidal frequencies (e.g., 1 MHz, 13.56 MHz, or 40 MHz). While a conventional sinusoidal waveform processing system requires a different sinusoidal waveform generation source for each different frequency utilized in a plasma processing recipe, in practice a single PV waveform generator 150 is able to generate an infinite number of pulse voltage frequencies with differing characteristics within a frequency range that is below the hardware limits of the PV waveform generator 150.

Due to the use of plasma source assemblies that are configured to deliver synchronized asymmetric voltage waveforms that can each be tailored and combined with other delivered asymmetric voltage waveforms, the control of one or more plasma characteristics, such as plasma density, plasma uniformity, and plasma sheath properties can be more precisely controlled without the problems commonly found in conventional RF matching and RF power delivery designs. Moreover, the ability to adjust the timing and characteristics of the asymmetric voltage waveforms, such as waveforms 303 and 225, that are each provided to one or more types of electrodes or coils in a plasma processing chamber has been found to improve the control of an ion energy distribution (IED) for the plasma generated ions that interact with a surface of a substrate during plasma processing. The methods and apparatus disclosed herein are configured to control and sustain a plasma formed in a processing region of the plasma processing chamber without the need for the delivery of a radio frequency (RF) waveform and the need for its supporting RF components during processing. For example, during a process of delivering a first asymmetric voltage waveform to a first electrode and delivering a second asymmetric voltage waveform to a second electrode the process is performed without another source of electrical energy (e.g., RF waveform) to sustain the plasma and perform the plasma process on a substrate.

In some embodiments, during substantially all of a plasma process performed on a substrate the plasma is not controlled by, affected by or sustained in the processing volume by use or the delivery of a sinusoidal waveform. The ability to synchronize and control waveform characteristics, such as frequency, slope of the portions of the voltage waveform, waveform shape and applied voltage on-time during a pulse period, of the voltage pulses provided in each of the pulsed voltage waveforms applied to different electrodes and/or coils allows for an improved control of a generated plasma. As a result, greater precision for plasma processing can be achieved.

The term "coupled" is used herein to refer to the direct or indirect coupling between two objects. For example, if object A physically touches object B and object B touches object C, then objects A and C may still be considered coupled to one another—even if objects A and C do not directly physically touch each other. For instance, a first object may be coupled to a second object even though the first object is never directly physically in contact with the second object.

While the foregoing is directed to embodiments of the present disclosure, other and further embodiments of the disclosure may be devised without departing from the basic scope thereof, and the scope thereof is determined by the claims that follow.

What is claimed is:

1. A plasma processing system, comprising:
a plurality of pulsed voltage waveform generators;
a plurality of electrodes or coils that are each positioned and configured to alter a characteristic of a plasma formed in a processing volume of a plasma processing chamber of the plasma processing system when an asymmetric voltage waveform is provided to the electrode or coil from a pulsed voltage waveform generator of the plurality of pulsed voltage waveform generators, wherein each electrode or coil is coupled to a different pulsed voltage waveform generator of the plurality of pulsed voltage waveform generators; and
a system controller that is configured to cause the plasma processing system to perform operations comprising:
delivering a first asymmetric voltage waveform from a first pulsed voltage waveform generator of the plurality of pulsed voltage waveform generators to a first electrode or a first coil of the plurality of electrodes or coils, wherein:
the first asymmetric voltage waveform is configured to alter a characteristic of the plasma formed in the processing volume of the plasma processing chamber,
the first asymmetric voltage waveform comprises a first voltage pulse that comprises a first stage, a second stage, and a third stage,
the second stage of the first voltage pulse is disposed between the first stage and the third stage, and
a voltage of the first voltage pulse within the first stage and the third stage varies with time;
delivering a second asymmetric voltage waveform from a second pulsed voltage waveform generator of the plurality of pulsed voltage waveform generators to a second electrode or a second coil of the plurality of electrodes or coils, wherein the second asymmetric voltage waveform is configured to alter a characteristic of the plasma formed in the processing volume of the plasma processing chamber; and
synchronizing the delivery of the first asymmetric voltage waveform to the first electrode or the first coil from the first pulsed voltage waveform generator and the second asymmetric voltage waveform to the second electrode or the second coil from the second pulsed voltage waveform generator.

2. The plasma processing system of claim 1, wherein:
the first coil is coupled to the first pulsed voltage waveform generator, and
the first asymmetric voltage waveform varies between a first voltage level and a second voltage level.

3. The plasma processing system of claim 2, wherein the first voltage level is a positive voltage level and the second voltage level is a negative voltage level.

4. The plasma processing system of claim 2, wherein:
the second coil is coupled to the second pulsed voltage waveform generator, and
the second asymmetric voltage waveform comprises a plurality of stages that vary between a third voltage level and a fourth voltage level.

5. The plasma processing system of claim 2, wherein:
the second electrode is coupled to the second pulsed voltage waveform generator, and
the second asymmetric voltage waveform comprises a plurality of stages that vary between a third voltage level and a fourth voltage level.

6. The plasma processing system of claim 5, wherein the third voltage level is a positive voltage level and the fourth voltage level is a negative voltage level.

7. The plasma processing system of claim 5, wherein when the second asymmetric voltage waveform reaches the fourth voltage level, and wherein the fourth voltage level is configured to generate a plasma sheath after the third voltage level is reached during each asymmetric voltage pulse.

8. A method of controlling a plasma formed in a plasma processing system, comprising:
delivering a first asymmetric voltage waveform from a first pulsed voltage waveform generator to a first electrode or a first coil, wherein:
the first asymmetric voltage waveform is configured to alter a characteristic of a plasma formed in a processing volume of a plasma processing chamber of the plasma processing system,
the first asymmetric voltage waveform comprises a first voltage pulse that comprises a first stage, a second stage, and a third stage,
the second stage of the first voltage pulse is disposed between the first stage and the third stage, and
a voltage of the first voltage pulse within the first stage and the third stage varies with time;
delivering a second asymmetric voltage waveform from a second pulsed voltage waveform generator to a second electrode or a second coil, wherein the second asymmetric voltage waveform is configured to alter a characteristic of the plasma formed in the processing volume of the plasma processing chamber; and
synchronizing the delivery of the first asymmetric voltage waveform and the second asymmetric voltage waveform.

9. The method of claim 8, wherein:
the first asymmetric voltage waveform is delivered to the first coil,
the second asymmetric voltage waveform is delivered to the second electrode, and
the first and second asymmetric voltage waveforms each comprises a plurality of stages.

10. The method of claim 9, wherein the first asymmetric voltage waveform varies between a first voltage level that is positive and a second voltage level that is negative.

11. The method of claim 10, wherein the second asymmetric voltage waveform comprises a plurality of stages that vary between a third voltage level and a fourth voltage level.

12. The method of claim 8, wherein:

the first asymmetric voltage waveform is delivered to the first coil, the second asymmetric voltage waveform is delivered to the second coil, and the first and second asymmetric voltage waveforms each comprises a plurality of stages.

13. The method of claim 8, wherein:

the second asymmetric voltage waveform comprises a second voltage pulse that comprises a first stage, a second stage, and a third stage, the second stage of the second voltage pulse is disposed between the first stage and the third stage of the second voltage pulse, and respective voltages of the first and second voltage pulses within the first stage and the third stage vary linearly with time.

14. The method of claim 8, wherein:

the second asymmetric voltage waveform comprises a second voltage pulse that comprises a first stage, a second stage, and a third stage, the second stage of the second voltage pulse is disposed between the first stage and the third stage of the second voltage pulse, and respective voltages of the first and second voltage pulses within the first stage and the third stage vary non-linearly with time.

15. The method of claim 8, wherein:

the first asymmetric voltage waveform comprises a plurality of voltage pulses that extend between a first voltage level and a second voltage level, the second asymmetric voltage waveform comprises a plurality of voltage pulses that extend between a third voltage level and a fourth voltage level, and at least one of the first voltage level, the second voltage level, the third voltage level, or the fourth voltage level is different.

16. The method of claim 8, wherein:

the first asymmetric voltage waveform comprises:

a plurality of voltage pulses that each comprises a first pulse period and at least one sloped region that has first slope $(dV_1/dt)$, wherein the first slope $(dV_1/dt)$ is equal to a slope $(dV_s/dt)$ of a sinusoidal waveform when measured at a phase angle at which the sinusoidal waveform crosses zero, and the sinusoidal waveform has a frequency between 1 MHz and 100 MHz, and a peak voltage between 500 volts and 5000 volts.

17. The method of claim 8, wherein delivering the first asymmetric voltage waveform and delivering the second asymmetric voltage waveform is performed without another source of electrical energy to sustain the plasma.

18. The method of claim 8, wherein a sinusoidal waveform is not present within the processing volume during the delivery of the first asymmetric voltage waveform and the delivering the second asymmetric voltage waveform.

19. The method of claim 8, wherein the plasma is not sustained in the processing volume by use of a sinusoidal waveform.

\* \* \* \* \*